US006967501B1

(12) United States Patent
Butka

(10) Patent No.: US 6,967,501 B1
(45) Date of Patent: Nov. 22, 2005

(54) IMPEDANCE-MATCHED OUTPUT DRIVER CIRCUITS HAVING ENHANCED PREDRIVER CONTROL

(75) Inventor: Brian Butka, Alpharetta, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 87 days.

(21) Appl. No.: 10/739,467

(22) Filed: Dec. 18, 2003

(51) Int. Cl.[7] .................. H03K 17/16; H03K 19/003
(52) U.S. Cl. .......................... 326/30; 326/83
(58) Field of Search .................. 326/30, 82, 83; 327/321, 328

(56) References Cited

U.S. PATENT DOCUMENTS

| | | |
|---|---|---|
| 4,731,553 A | 3/1988 | Van Lehn et al. |
| 4,829,199 A | 5/1989 | Prater |
| 4,833,349 A | 5/1989 | Liu et al. |
| 4,972,100 A | 11/1990 | Lim et al. |
| 5,122,690 A | 6/1992 | Bianchi |
| 5,153,450 A | 10/1992 | Ruetz |
| 5,166,555 A | 11/1992 | Kano |
| 5,166,558 A * | 11/1992 | Ohsawa .................. 326/71 |
| 5,293,082 A | 3/1994 | Bathaee |
| 5,313,435 A | 5/1994 | Kim et al. |
| 5,319,258 A | 6/1994 | Ruetz |
| 5,497,105 A | 3/1996 | Oh et al. |
| 5,528,192 A | 6/1996 | Agiman |
| 5,559,447 A | 9/1996 | Rees |
| 5,717,343 A | 2/1998 | Kwong |
| 5,739,714 A | 4/1998 | Gabara |
| 5,801,549 A * | 9/1998 | Cao et al. .................. 326/83 |
| 5,834,948 A | 11/1998 | Yoshizaki et al. |
| 5,880,606 A | 3/1999 | Griesbach |

(Continued)

FOREIGN PATENT DOCUMENTS

EP    000449251 A2 * 10/1992    ....... H03K 19/0185

OTHER PUBLICATIONS

Fan et al., "On-Die Termination Resistors with Analog Impedance Control for Standard CMOS Technology," IEEE Journal of Solid-State Circuits, vol. 38, No. 2, Feb. 2003, pp. 361-364.

U.S. Appl. No. 10/616,272, filed Jul. 9, 2003.

Primary Examiner—Daniel Chang
(74) Attorney, Agent, or Firm—Myers Bigel Sibley & Sajovec

(57) ABSTRACT

Impedance-matched output driver circuits utilize predriver circuits with analog control to provide enhanced operating characteristics. This analog control may be provided by an analog loop containing differential amplifiers that set the resolution limit of the output driver circuit. These output driver circuits include a first PMOS pull-up transistor having source and drain terminals electrically connected in series in a pull-up path of the output driver circuit. An NMOS pass transistor has a first current carrying terminal electrically connected to a gate terminal of the first PMOS pull-up transistor and a second current carrying terminal configured to receive a P-type analog reference voltage (VP). This P-type reference voltage controls the conductivity of the first PMOS pull-up transistor in the pull-up path. A gate terminal of the NMOS pass transistor is responsive to a pull-up data input signal (DINP). A first NMOS pull-down transistor has source and drain terminals that are electrically connected in series in a pull-down path of the output driver circuit. A PMOS pass transistor is provided having a first current carrying terminal electrically connected to a gate terminal of the first NMOS pull-down transistor and a second current carrying terminal configured to receive an N-type analog reference voltage (VN). This N-type reference voltage controls the conductivity of the first NMOS pull-down transistor in the pull-down path. A gate terminal of the PMOS pass transistor is responsive to a pull-down data input signal (DINN).

12 Claims, 6 Drawing Sheets

U.S. PATENT DOCUMENTS

| | | |
|---|---|---|
| 5,892,371 A | 4/1999 | Maley |
| 5,991,908 A | 11/1999 | Baxter et al. |
| 6,014,046 A | 1/2000 | Douse et al. |
| 6,031,394 A | 2/2000 | Cranford, Jr. et al. |
| 6,057,710 A | 5/2000 | Singh |
| 6,064,227 A | 5/2000 | Saito |
| 6,071,314 A | 6/2000 | Baxter et al. |
| 6,081,132 A | 6/2000 | Isbara |
| 6,091,260 A | 7/2000 | Shamarao |
| 6,118,310 A | 9/2000 | Esch, Jr. |
| 6,133,749 A | 10/2000 | Hansen et al. |
| 6,208,168 B1 | 3/2001 | Rhee |
| 6,225,824 B1 | 5/2001 | Madhu et al. |
| 6,242,942 B1 | 6/2001 | Shamarao |
| 6,285,215 B1 | 9/2001 | Voshell |
| 6,316,977 B1 | 11/2001 | Sargeant |
| 6,326,821 B1 | 12/2001 | Gabara |
| 6,351,172 B1 | 2/2002 | Ouyang et al. |
| 6,353,346 B1 | 3/2002 | Chan |
| 6,356,102 B1 | 3/2002 | Klein et al. |
| 6,362,656 B2 | 3/2002 | Rhee |
| 6,388,499 B1 | 5/2002 | Tien et al. |
| 6,420,914 B1 | 7/2002 | Hasegawa |
| 6,433,579 B1 | 8/2002 | Wang et al. |
| 6,437,599 B1 | 8/2002 | Groen |
| 6,509,770 B2 | 1/2003 | Gossmann et al. |
| 6,529,082 B1 | 3/2003 | Boerstler et al. |
| 6,552,565 B2 | 4/2003 | Chang et al. |
| 6,570,405 B1 | 5/2003 | Lien |
| 6,650,156 B1 | 11/2003 | Reid et al. |
| 2001/0000949 A1 | 5/2001 | Rhee |

* cited by examiner

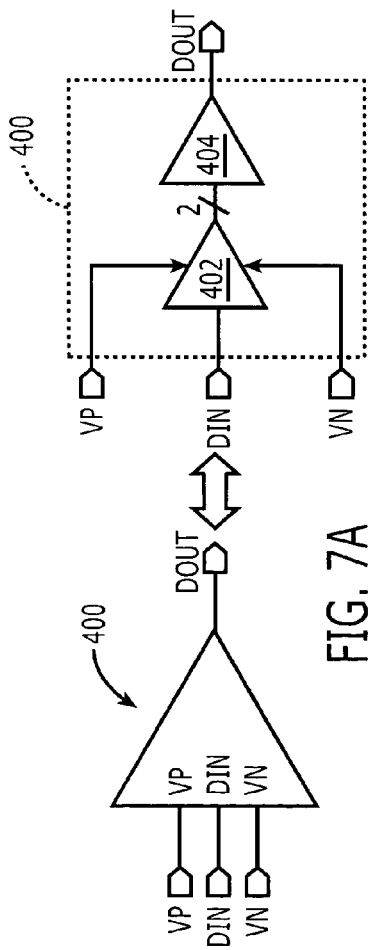
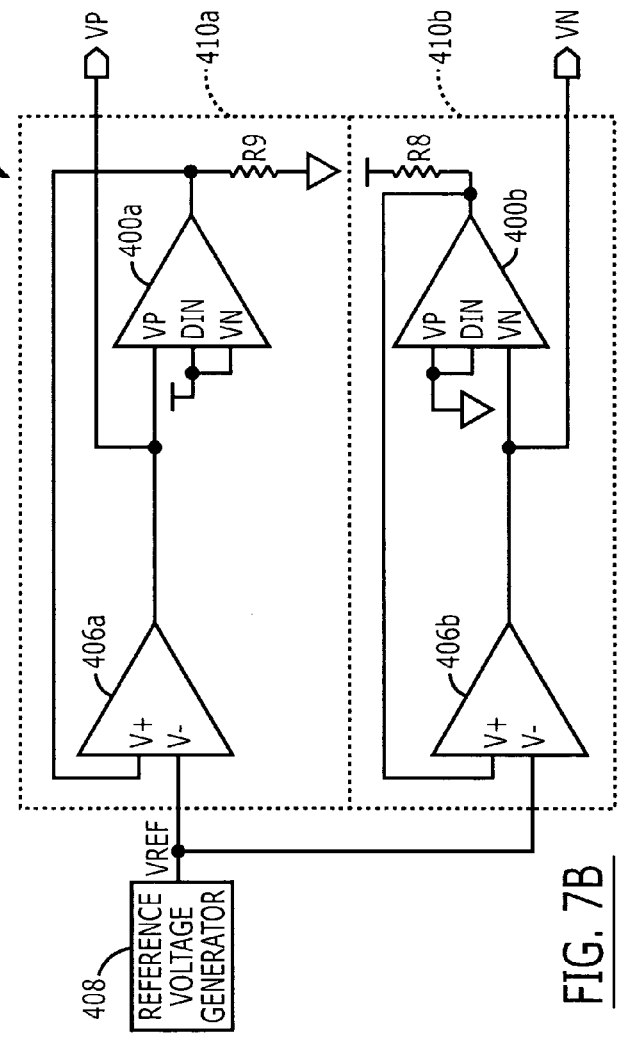

IMPEDANCE-MATCHED OUTPUT DRIVER CIRCUITS HAVING ENHANCED PREDRIVER CONTROL

CROSS-REFERENCE TO RELATED APPLICATION

This application is related to U.S. application Ser. No. 10/616,272, filed Jul. 9, 2003, the disclosure of which is hereby incorporated herein by reference.

FIELD OF THE INVENTION

The present invention relates to integrated circuit devices and, more particularly, to output driver circuits that drive off-chip loads.

BACKGROUND OF THE INVENTION

Output driver circuits are frequently configured to have impedance matching characteristics that enable off-chip loads to be driven more efficiently. FIG. 1 illustrates a conventional impedance-matched output driver circuit 10 having a totem pole arrangement of PMOS pull-up transistors and NMOS pull-down transistors therein. As illustrated, a pull-up path of the driver circuit 10 includes a plurality of PMOS pull-up transistors, shown as MP0 and MP1, and a pull-down path of the driver circuit 10 includes a plurality of NMOS pull-down transistors, shown as MN0 and MN1. The PMOS pull-up transistor MP0, which is responsive to an active low input signal PUX, operates as a pass transistor that becomes active when an output terminal (OUT) of the driver circuit 10 is to be switched low-to-high. However, the PMOS pull-up transistor MP1 may comprise a plurality of parallel-connected PMOS transistors that are responsive to respective bits of a multi-bit pull-up control signal. This multi-bit pull-up control signal, which is an active low signal, is shown as PUX_CODE. In some cases, the plurality of parallel-connected PMOS transistors may represent an array of binary weighted transistors that are selectively enabled to match impedance characteristics of a load (not shown) connected to the output terminal OUT. The value of the pull-up control signal PUX_CODE may be updated periodically to maintain the impedance matching characteristics of the driver circuit 10.

The NMOS pull-down transistor MP0, which is responsive to an active high input signal PD, operates as a pass transistor that becomes active when an output terminal OUT of the driver circuit 10 is to be switched high-to-low. The NMOS pull-down transistor MN1 may comprise a plurality of parallel-connected NMOS transistors that are responsive to respective bits of a multi-bit pull-down control signal. This multi-bit pull-down control signal, which is an active high signal, is shown as PD_CODE. The plurality of parallel-connected NMOS transistors may represent an array of binary weighted transistors that are selectively enabled to match impedance characteristics of the load. The value of the pull-down control signal PD_CODE may be updated periodically to maintain the impedance matching characteristics of the driver circuit 10.

As will be understood by those skilled in the art, the pass transistors MP0 and MN0 will go into saturation before the output terminal OUT switches through ½VDDQ, when VDDQ, which is the power supply voltage, is reduced. As illustrated by the I-V curve of FIG. 2, when the output terminal OUT of the driver circuit 10 of FIG. 1 is swept from GND to VDDQ, a highly nonlinear I-V characteristic is observed after the voltage of the output terminal ($V_{OUT}$) exceeds about ½VDDQ, where VDDQ=1.5 Volts. Furthermore, the speed of the driver circuit 10 may be limited by the fact that both the pull-up and pull-down paths include a serial connection of two transistors, which means that relatively large transistors are required to maintain sufficiently high switching speed.

FIG. 3 illustrates another conventional driver circuit 12 that includes two parallel pull-up paths and two parallel pull-down paths. The pull-up paths include the series combination of PMOS transistors MP0 and MP1 in parallel with PMOS transistor MP2. The pull-down paths include the series combination of NMOS transistors MN0 and MN1 in parallel with NMOS transistor MN2. The PMOS transistor MP0 and the NMOS transistor MN0 are configured as MOS diodes, which operate to improve the linearity of the driver circuit 12. However, because two of the transistor gates are connected to the output terminal OUT, the driver circuit 12 of FIG. 3 may have relatively poor electrostatic discharge (ESD) characteristics and relatively high output capacitance. The ESD characteristics of the driver circuit 12 may be improved by adding resistors at the gate terminal of PMOS transistor MP0 and gate terminal of NMOS transistor MN0, however this will result in an RC delay that may limit voltage tracking between the gate terminals of the transistors MP0 and MN0 and the output terminal OUT. The use resistors for ESD protection in output driver circuits is also disclosed in an article by Y. Fan et al., entitled "On-Die Termination Resistors with Analog Impedance Control for Standard CMOS Technology," IEEE Journal of Solid-State Circuits, Vol. 38, No. 2., pp. 361–364, February (2003). In particular, FIG. 3 of the Fan article illustrates an analog on-die termination (ODT) bias generator that provides a bias signal to an output driver having an ODT unit therein.

Notwithstanding these conventional output driver circuits, there continues to be a need for driver circuits having enhanced operating characteristics.

SUMMARY OF THE INVENTION

Impedance-matched output driver circuits according to embodiments of the present invention utilize predriver circuits with analog impedance control to provide enhanced operating characteristics. Moreover, because the impedance control is provided by a predriver circuit, the control circuitry does not affect the output driver size. This analog control may be provided by an analog loop containing differential amplifiers that set the resolution limit of the output driver circuit. These output driver circuits include a first PMOS pull-up transistor having source and drain terminals electrically connected in series in a pull-up path of the output driver circuit. An NMOS pass transistor is also provided. The NMOS pass transistor has a first current carrying terminal (e.g., drain) electrically connected to a gate terminal of the first PMOS pull-up transistor and a second current carrying terminal (e.g., source) configured to receive a P-type reference voltage (VP). This P-type reference voltage controls the conductivity of the first PMOS pull-up transistor in the pull-up path. A gate terminal of the NMOS pass transistor is responsive to a pull-up data input signal (DINP). Accordingly, when the pull-up data input signal is set high, the NMOS pass transistor operates to pull down the gate terminal of the first PMOS pull-up transistor to a level set by the P-type reference voltage.

A first NMOS pull-down transistor is also provided. This first NMOS pull-down transistor has source and drain terminals that are electrically connected in series in a pull-down path of the output driver circuit. A PMOS pass transistor is provided having a first current carrying terminal (e.g., drain) electrically connected to a gate terminal of the first NMOS pull-down transistor and a second current carrying terminal (e.g., source) configured to receive an N-type reference voltage. This N-type reference voltage controls the conductivity of the first NMOS pull-down transistor in the pull-down path. A gate terminal of the PMOS pass transistor is responsive to a pull-down data input signal (DINN), which may be the same as the pull-up data input signal (DINP). Accordingly, when the pull-down data input signal is set low, the PMOS pass transistor operates to pull-up the gate terminal of the first NMOS pull-up transistor to a level set by the N-type reference voltage.

The output driver circuit may also include a second PMOS pull-up transistor having a first current carrying terminal (e.g., drain) electrically connected to the gate terminal of the first PMOS pull-up transistor, a second current carrying terminal (e.g., source) electrically coupled to a power supply line (e.g., Vdd) and a gate terminal responsive to the pull-up data input signal (DINP). A second NMOS pull-down transistor is provided having a first current carrying terminal (e.g., drain) electrically connected to the gate terminal of the first NMOS pull-down transistor, a second current carrying terminal (e.g., source) electrically coupled to a ground reference line (e.g., Vss) and a gate terminal responsive to the pull-down data input signal (DINN).

The degree of linearity of the operating characteristics of the output driver circuit may be improved by including a third PMOS pull-up transistor having a first current carrying terminal (e.g., source) electrically connected to the power supply line and a gate terminal electrically connected to the gate terminal of the first PMOS pull-up transistor. A MOS-connected diode may also be included. An anode of the diode is electrically connected to a second current carrying terminal (e.g., drain) of the third PMOS pull-up transistor and a cathode of the diode is electrically connected to an output of the output driver circuit. A resistor, having a first terminal electrically connected to the output of the output driver circuit and a second terminal electrically connected to the drain terminal of said first PMOS pull-up transistor, may also be provided to improve linearity.

An impedance matching IO driver circuit according to additional embodiments of the present invention includes a first output driver circuit that is configured to generate a data output signal (DOUT) in response to a data input signal (DIN) and first and second reference voltages (e.g., VP and VN). A second "reference" output driver circuit, which matches the first output driver circuit, is also provided as part of an analog loop that generates the first and second reference voltages as control voltages. These reference voltages change in response to temperature, power supply and resistance changes in external resistors that are used to set the pull-up and pull-down impedances of the first output driver circuit. In particular, the second output driver circuit is configured to generate first and second reference output signals in response to the first and second reference voltages (VP and VN) and first and second fixed voltage input signals (e.g., Vdd and Vss).

The analog loop also includes a first differential amplifier, which is configured to generate the first reference voltage (VP) in response to a first differential input signal and the first reference output signal. The analog loop also includes a second differential amplifier, which is configured to generate the second reference voltage (VN) in response to the first differential input signal and the second reference output signal. The impedance matching characteristics are provided by coupling the first and second reference output signals to off-chip resistors having values to be matched by the pull-up and pull-down paths in the first output driver circuit. In particular, a first off-chip resistor may be provided having a first terminal that is electrically connected to a ground reference line (Vss) and a second terminal that is configured to receive the first reference output signal. Similarly, a second off-chip resistor may be provided having a first terminal that is electrically connected to a power supply line (Vdd) and a second terminal that is configured to receive the second reference output signal. An on-chip voltage source may also be provided to generate the first differential input signal as a fixed voltage. This fixed voltage may have a magnitude equivalent to about one-half a magnitude of a power supply voltage that is applied to the first output driver circuit. The on-chip voltage source may be defined by a totem-pole arrangement of resistors that are connected between the power supply line and the ground reference line.

BRIEF DESCRIPTION OF THE DRAWINGS

FIG. 7A is an electrical schematic that illustrates an output driver circuit according to additional embodiments of the present invention.

FIG. 7B is an electrical schematic of a reference voltage generator according to additional embodiments of the present invention.

DETAILED DESCRIPTION OF PREFERRED EMBODIMENTS

Figure 1:
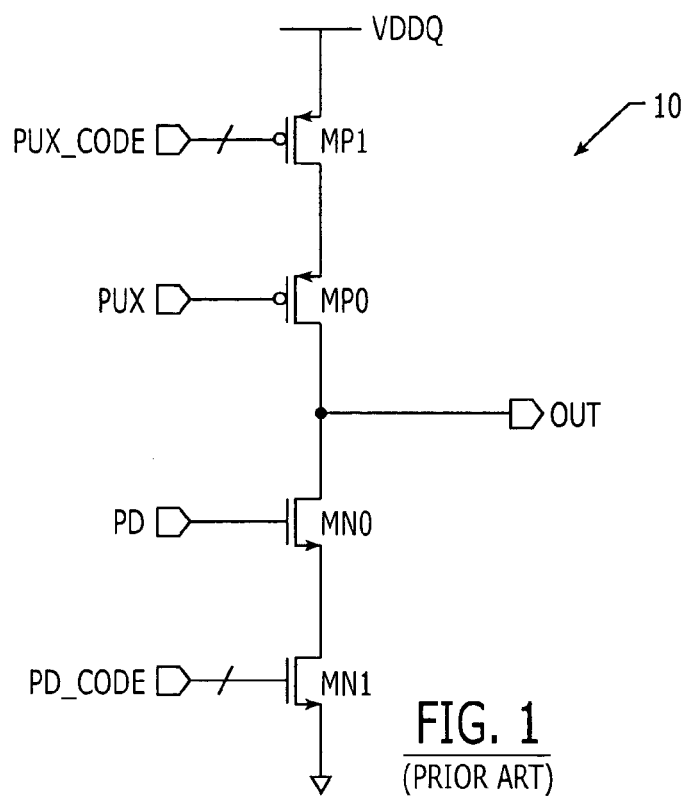
FIG. 1 is an electrical schematic of a conventional impedance-matched output driver circuit having a totem pole arrangement of PMOS pull-up transistors and NMOS pull-down transistors therein.
Figure 2:
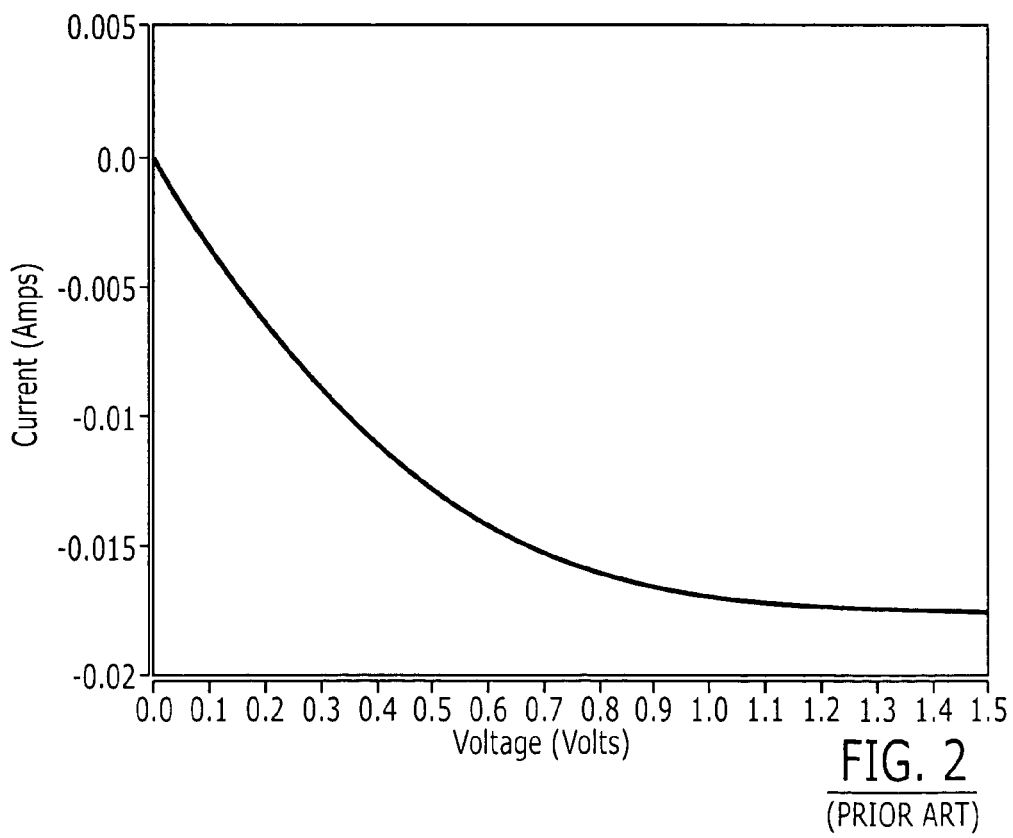
FIG. 2 is an I-V curve that illustrates the pull-down characteristics of the driver circuit of FIG. 1.
Figure 3:
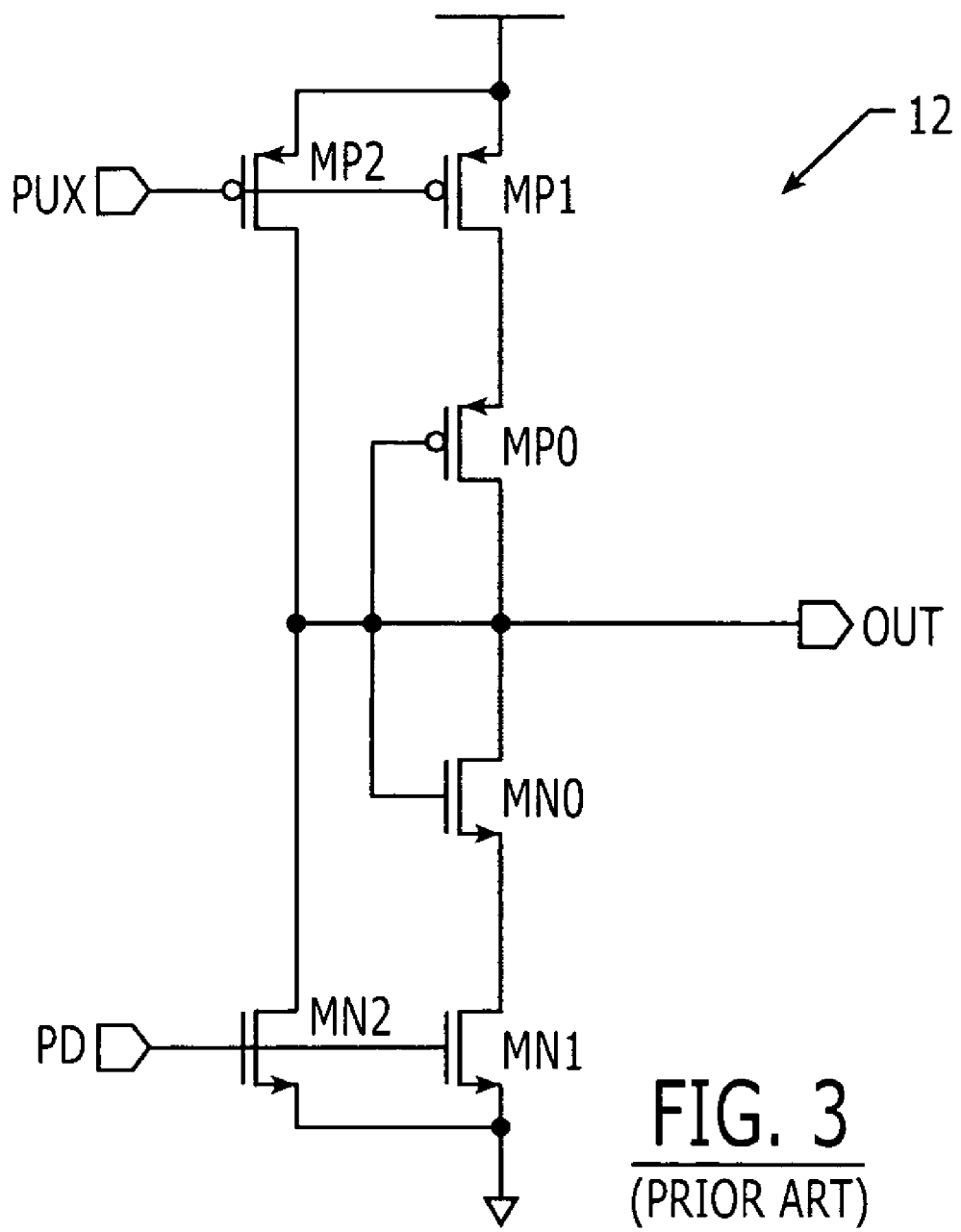
FIG. 3 is an electrical schematic of a conventional impedance-matched output driver circuit having MOS diodes therein that compensate for non-linear MOS characteristics.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 4:
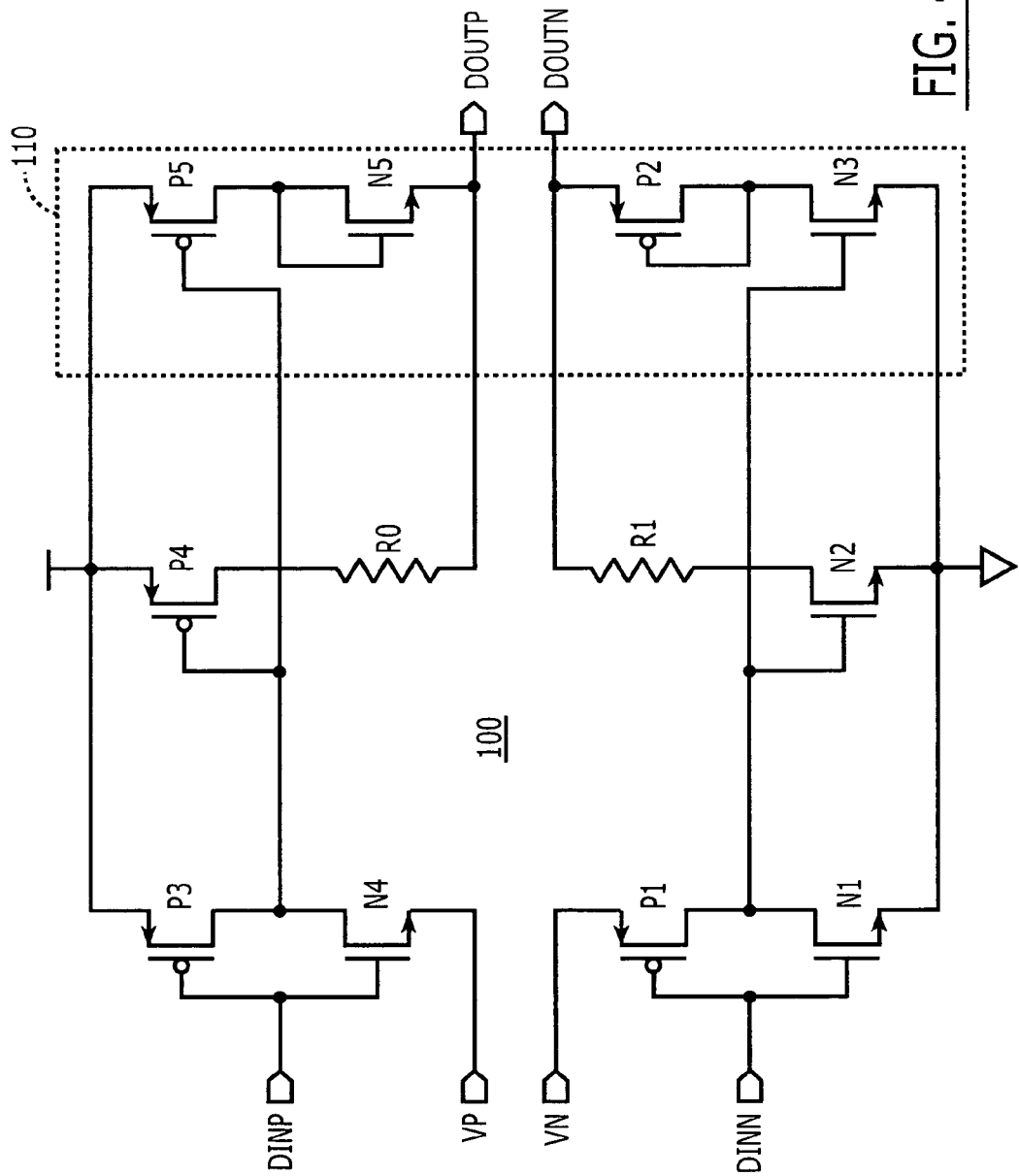
FIG. 4 is an electrical schematic of an output driver circuit according to an embodiment of the present invention.

Referring now to FIG. 4, an output driver circuit 100 according to an embodiment of the present invention is configured to receive a pair of data input signals DINP and DINN and generate a pair of data output signals DOUTP and DOUTN. As described more fully hereinbelow with respect to FIG. 6, when driving a load (e.g., off-chip load), the data input terminals DINP and DINN of the output driver circuit 100 are connected together and receive the same data input signal and the data output terminals DOUTP and DOUTN are connected together and generate the same data output signal DOUT. The output driver circuit 100 includes a primary pull-up path and a primary pull-down path. The primary pull-up path, which extends between the pull-up output terminal DOUTP and a power supply line (e.g., Vdd), includes a first PMOS pull-up transistor P4 and a resistor R0. As illustrated, the first PMOS pull-up transistor P4 has a source that is electrically connected to the power supply line and a drain that is electrically connected to a terminal of the resistor R0. The conductivity of this primary pull-up path is influenced by the magnitude of the gate voltage applied to a gate terminal of the first PMOS pull-up transistor P4. When the primary pull-up path is active to drive the pull-up output terminal DOUTP with a logic 1 voltage, the gate voltage at the gate terminal of the first PMOS pull-up transistor P4 is set by the magnitude of the P-type reference voltage VP. The magnitude of the P-type reference voltage may fluctuate during operation, but should remain in a range sufficient to maintain the first PMOS pull-up transistor P4 in its linear region of operation.

In particular, when the pull-up data input signal DINP is switched low-to-high, the NMOS pass transistor N4 turns on to thereby pull-down the gate terminal of the first PMOS pull-up transistor P4 to the voltage of the P-type reference voltage VP. In this manner, the magnitude of the P-type reference voltage VP operates to set the impedance of the primary pull-up path when the pull-up data input signal DINP is switched low-to-high. In contrast, when the pull-up data input signal DINP is switched high-to-low, the NMOS pass transistor N4 turns off and a second PMOS pull-up transistor P3 turns on to thereby pull the gate terminal of the first PMOS pull-up transistor P4 to a logic 1 voltage. When this happens, the primary pull-up path is rendered in a high impedance state.

The primary pull-down path, which extends between the pull-down output terminal DOUTN and a ground reference line (e.g., Vss), includes a first NMOS pull-down transistor N2 and a resistor R1. As illustrated, the first NMOS pull-down transistor N2 has a source that is electrically connected to the ground reference line and a drain that is electrically connected to a terminal of the resistor R1. The conductivity of this primary pull-down path is influenced by the magnitude of the gate voltage applied to a gate terminal of the first NMOS pull-down transistor N2. When the primary pull-down path is active to drive the pull-down output terminal DOUTN with a logic 0 voltage, the gate voltage at the gate terminal of the first NMOS pull-down transistor N2 is set by the magnitude of the N-type reference voltage VN. The magnitude of the N-type reference voltage may fluctuate during operation, but should remain in a range sufficient to maintain the first NMOS pull-down transistor N2 in its linear region of operation.

In particular, when the pull-down data input signal DINN is switched high-to-low, the PMOS pass transistor P4 turns on to thereby pull-up the gate terminal of the first NMOS pull-down transistor N2 to the voltage of the N-type reference voltage VN. In this manner, the magnitude of the N-type reference voltage VN operates to set the impedance of the primary pull-down path when the pull-down data input signal DINN is switched high-to-low. In contrast, when the pull-down data input signal DINN is switched lwo-to-high, the PMOS pass transistor P1 turns off and a second NMOS pull-down transistor N1 turns on to thereby pull the gate terminal of the first NMOS pull-down transistor N2 to a logic 0 voltage. When this happens, the primary pull-down path is rendered in a high impedance state.

To enhance the linearity of the output driver circuit 100 when driving loads, secondary pull-up and pull-down paths are provided within a secondary output stage 110. The secondary pull-up path includes a diode and a third PMOS pull-up transistor P5. The secondary pull-down path includes a diode and a third NMOS pull-down transistor N3. The diode within the secondary pull-up path is shown as a NMOS transistor N5 having gate and drain terminals that are electrically connected together. The diode within the secondary pull-down path is shown as a PMOS transistor P2 having gate and drain terminals that are electrically connected together. The secondary pull-up path becomes conductive during an early portion of a pull-up transition at the pull-up output terminal DOUTP, but transitions to a high impedance state once the pull-up output terminal DOUTP is pulled high to a level within one threshold voltage below the power supply voltage (Vdd). This threshold voltage corresponds to the threshold voltage of the NMOS transistor N5. Similarly, the secondary pull-down path becomes conductive during an early portion of a pull-down transition at the pull-down output terminal DOUTN, but transitions to a high impedance state once the pull-down output terminal DOUTN is pulled low to a level within one threshold voltage above the ground reference voltage (Vss). This threshold voltage corresponds to the threshold voltage of the NMOS transistor N3.

Figure 6:
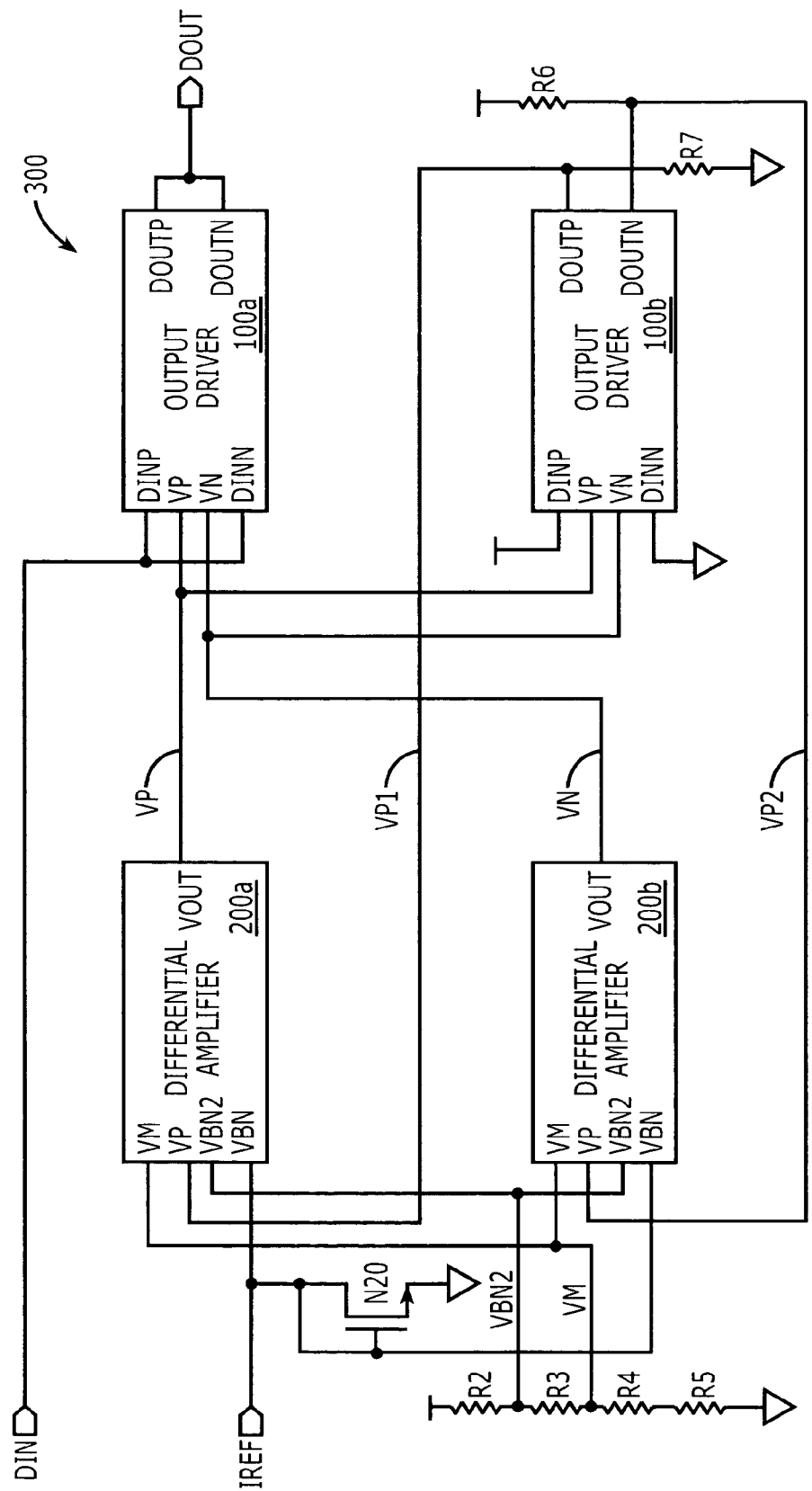
FIG. 6 is a block diagram of an impedance matching IO control system according to embodiments of the present invention.

The output driver circuit 100 of FIG. 4 is used within the impedance matching IO driver circuit 300 of FIG. 6, which includes circuits that collectively form an analog loop. In the impedance matching IO driver circuit 300 of FIG. 6, a primary output driver circuit 100a is illustrated along with a reference output driver circuit 100b, which matches the primary output driver circuit 100a. The reference output driver circuit 100b has a pull-up output terminal DOUTP that is electrically connected to a reference resistor R7 and a pull-down output terminal DOUTN that is electrically connected to a reference resistor R6. These reference resistors may be off-chip resistors having a predetermined value (e.g., 50 ohms). The analog loop operates so that the value of the reference resistor R6 is matched by the combined parallel impedance of the primary and secondary pull-down paths within the primary output driver circuit 100a and the value of the reference resistor R7 is matched by the combined parallel impedance of the primary and secondary pull-up paths within the primary output driver circuit 100a. In some embodiments, the two resistors R6 and R7 may be replaced by a single resistor that is tied to 0.5Vdd. In other embodiments, a single reference resistor may be used to match a pull-up impedance and then the matched pull-up impedance may be used to program the pull-down impedance.

The impedance matching IO driver circuit 300 also include a pair of differential amplifiers 200a and 200b that generate the P-type reference voltage VP and N-type reference voltage VN, respectively, and set the resolution limit of the primary output driver circuit 100a. These reference voltages VP and VN are provided as control signals to the primary output driver circuit 100a. The pair of differential amplifiers 200a and 200b and the reference output driver circuit 100b collectively define a predriver circuit. This predriver circuit sets the drive impedances of the primary output driver circuit 100b with two control signals (i.e., VP and VN), without affecting the output driver size. These differential amplifiers may be configured as two-stage differential amplifiers 200, as illustrated by FIG. 5.

Figure 5:
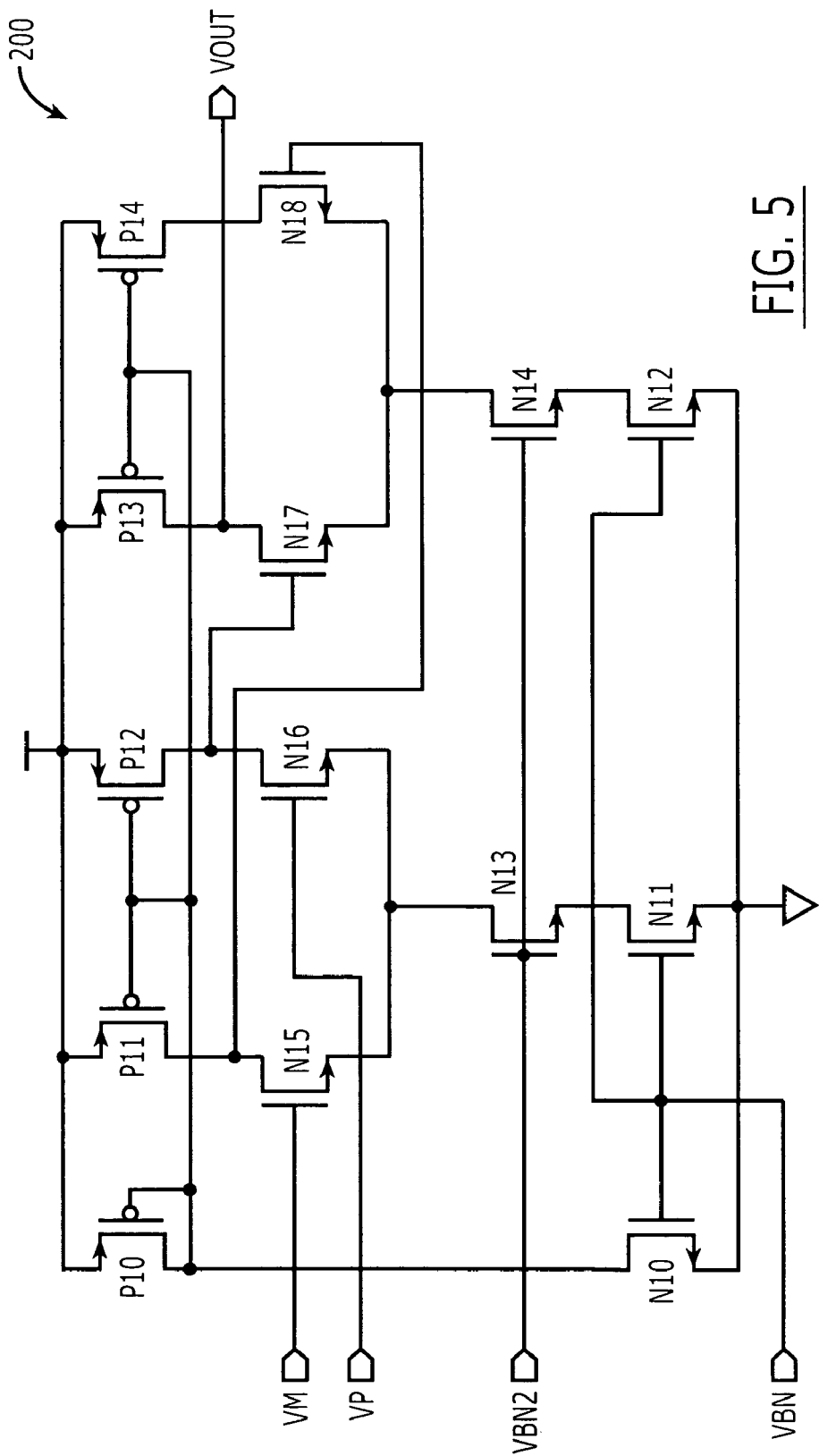
FIG. 5 is an electrical schematic of a two-stage differential amplifier that may be used in the impedance matching IO control system of FIG. 6.

In FIG. 5, the first stage of the differential amplifier 200 includes NMOS transistors N11, N3, N15 and N16 and PMOS load transistors P11 and P12. The second stage of the differential amplifier 200 includes NMOS transistors N12, N14, N17 and N18 and PMOS load transistors P13 and P14. A current mirror, provided by NMOS transistor N10 and PMOS transistor P10, is also provided to set the tail current in each stage of the differential amplifier 200. The magnitude of the tails currents is set by the magnitudes of a pair of tail current bias voltages VBN and VBN2. As illustrated by FIG. 6, the first tail current bias voltage VBN is set by a reference current IREF that is forced through the drain-to-source path of NMOS transistor N20. This sets the first tail current bias voltage VBN equal to the drain-to-source voltage Vds across NMOS transistor N20. The second tail current bias voltage VBN2 is set at a higher level relative to the first tail current bias voltage VBN. The magnitude of the second tail current bias voltage VBN2 may be set by a totem pole arrangement of resistors, shown as R2–R5. If the values of the resistors R2–R5 are equivalent (e.g., 1000 ohms), then the value of the second tail current bias voltage VBN2 may equal 0.75Vdd.

The magnitude of the voltage at the output VOUT of the differential amplifier 200 is set by the values of the differential data input signals VM and VP. As will be understood by those skilled in the art, the voltage gain of the two stages of the differential amplifier 200 may be increased by reducing the tail currents, however, such reductions will also operate to reduce the slew rate and bandwidth of the differential amplifier 200. Because the differential amplifier 200 does not have to be high speed in the illustrated embodiment, the values of the tail currents are not critical to the performance of the impedance matching IO driver circuit 300. Nonetheless, the slew rate of the predriver circuit can be controlled by varying the values of the tail currents and this may be useful in reducing the supply/ground bounce produced at the output of the primary output driver circuit 100a.

Referring again to FIG. 6, the differential data input VP associated with the first differential amplifier 200a receives a feedback reference voltage VP1, which is generated by the pull-up output terminal DOUTP of the reference output driver circuit 100b. The differential data input VP associated with the second differential amplifier 200a receives a feedback reference voltage VP2, which is generated by the pull-down output terminal DOUTN of the reference output driver circuit 100b. The differential data inputs VM associated with the first and second differential amplifiers 200a and 200b receive a fixed reference voltage. This fixed reference voltage is illustrated as being set by the totem pole arrangement of resistors, shown as R2–R5. If the values of the resistors R2–R5 are equivalent, then the value of the fixed reference voltage may equal 0.5Vdd.

Based on this configuration of the impedance matching IO driver circuit 300, changes in the values of the reference resistors R6 and R7 translate into changes in the feedback reference voltages VP1 and VP2. As these feedback reference voltages VP1 and VP2 change, the outputs VP and VN of the differential amplifiers 200a and 200b also change to compensate for the resistance changes. These outputs VP and VN, which are provided to the primary and reference output drivers 100a and 100b, cause the impedances of the pull-up and pull-down paths within the reference output driver 100b to change until they match the values of the reference resistors R6 and R7 and the feedback reference voltages VP1 and VP2 equal 0.5Vdd (i.e., the value of the fixed reference voltage VM). Similarly, because the primary and reference output drivers 100a and 100b match each other, the impedances of the pull-up and pull-down paths within the primary output driver 100a will also change until they match the values of the reference resistors R6 and R7.

Referring now to FIG. 7A, an output driver circuit 400 according to another embodiment of the present invention includes a predrive device 402 and an output driver device 404, which may be of conventional design. The predrive device 402 is configured to pass the P-type reference voltage VP to the output driver device 404 when the data input signal DIN is switched low-to-high and pass the N-type reference voltage VN to the output driver device 404 when the data input signal DIN is switched high-to-low. The P-type reference voltage VP is preferably generated at a level which maintains one or more transistors in the pull-up path(s) of the output driver device 404 in its linear region of operation, which means the pull-up impedance of the pull-up path(s) can be carefully controlled in response to small signal changes in the magnitude of the P-type reference voltage VP. Similarly, the N-type reference voltage VN is preferably generated at a level which maintains one or more transistors in the pull-down path(s) of the output driver device 404 in its linear region of operation, which means the pull-down impedance of the pull-down path(s) can be carefully controlled in response to small signal changes in the magnitude of the N-type reference voltage VN. The output of the predrive device 402 is illustrated as having a width of two lines. When the P-type reference voltage VP is passed on a first of the two lines, the second of the two lines may receive a voltage that turns off the pull-down path(s) within the output driver device 404. In contrast, when the N-type reference voltage VN is passed on the second of the two lines, the first of the two lines may receive a voltage that turns off the pull-up path(s) within the output driver device 404. Accordingly, the operation of the output driver circuit 400 of FIG. 7A is similar to the operation of the output driver circuit 100 of FIG. 4.

The output driver circuit 400 of FIG. 7A may be utilized within the P-type and N-type reference voltage generator 410 FIG. 7B, which is illustrated as including a pair of differential amplifiers 406a and 406b and a pair of reference output driver circuits 400a and 400b. This reference voltage generator 410 operates with the predrive device 402 of FIG. 7A to supply the P-type and N-type reference voltages VP and VN to the output driver device 404. As illustrated, the first differential amplifier 406a and the first reference output driver circuit 400a collectively form a PMOS control loop 410a that generates a P-type reference voltage VP, which varies in response to changes in a reference resistor R9 (e.g., off-chip resistor). Similarly, the second differential amplifier 406b and second reference output driver circuit 400b collectively form an NMOS control loop 410b that generates an N-type reference voltage VN, which varies in response to changes in a reference resistor R8 (e.g., off-chip resistor). Both of these control loops receive a fixed reference voltage VREF, which is generated by a reference voltage generator 408. In alternative embodiments, a single control loop may be used to reduce the amount of circuitry required to generate the P-type and N-type reference voltages, however, a dual loop circuit is illustrated for ease of understanding.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An impedance matching IO driver circuit, comprising:
  a first output driver circuit that is configured to generate a data output signal in response to a data input signal and first and second reference voltages;
  a second output driver circuit that is configured to generate first and second reference output signals in response to the first and second reference voltages and first and second fixed voltage input signals;
  a first differential amplifier that is configured to generate the first reference voltage in response to a first differential input signal and the first reference output signal; and
  a second differential amplifier that is configured to generate the second reference voltage in response to the first differential input signal and the second reference output signal.

2. The driver circuit of claim 1, wherein said first and second output driver circuits are equivalent circuits.

3. The driver circuit of claim 1, further comprising:
  a first resistor having a first terminal electrically connected to a ground reference line and a second terminal that is configured to receive the first reference output signal; and
  a second resistor having a first terminal electrically connected to a power supply line and a second terminal that is configured to receive the second reference output signal.

4. The driver circuit of claim 1, further comprising a voltage source that is configured to generate the first differential input signal as a fixed voltage.

5. The driver circuit of claim 4, wherein the fixed voltage has a magnitude equivalent to about one-half a power supply voltage applied to said first output driver circuit.

6. The driver circuit of claim 5, wherein said first differential amplifier is a two-stage differential amplifier that is responsive to first and second tail current bias voltages; and wherein a magnitude of the first tail current bias voltage is greater than the fixed voltage.

7. The driver circuit of claim 1, wherein said first differential amplifier is a two-stage differential amplifier that is responsive to a pair of tail current bias voltages.

8. The driver circuit of claim 1, wherein said first output driver circuit comprises:
  a first PMOS pull-up transistor having source and drain terminals electrically connected in series in a pull-up path of said first output driver circuit;
  a first NMOS pull-down transistor having source and drain terminals electrically connected in series in a pull-down path of said first output driver circuit;
  an NMOS pass transistor having a first current carrying terminal electrically connected to a gate terminal of said first PMOS pull-up transistor, a second current carrying terminal configured to receive the first reference voltage and a gate terminal responsive to the data input signal; and
  a PMOS pass transistor having a first current carrying terminal electrically connected to a gate terminal of said first NMOS pull-down transistor, a second current carrying terminal configured to receive the second reference voltage and a gate terminal responsive to the data input signal.

9. The driver circuit of claim 8, further comprising:
  a second PMOS pull-up transistor having a first current carrying terminal electrically connected to the gate terminal of said first PMOS pull-up transistor, a second current carrying terminal electrically coupled to a power supply line and a gate terminal responsive to the data input signal; and
  a second NMOS pull-down transistor having a first current carrying terminal electrically connected to the gate terminal of said first NMOS pull-down transistor, a second current carrying terminal electrically coupled to a ground reference line and a gate terminal responsive to the data input signal.

10. An impedance matching IO driver circuit, comprising:
  a primary output driver circuit that is configured to drive a load in response to a data input signal; and
  an analog control loop that is configured to drive said primary output driver circuit with a pair of analog control voltages, said analog control loop comprising:
    a reference output driver circuit that is matched to said primary output driver circuit and is electrically connected to at least one reference resistor; and
    first and second differential amplifiers that generate respective ones of the pair of analog control voltages in response to at least one output signal generated by said reference output driver circuit.

11. The driver circuit of claim 10, wherein said first and second differential amplifiers are two-stage amplifiers.

12. The driver circuit of claim 10, wherein said reference output driver circuit is electrically connected to a pair of reference resistors; and wherein said first and second differential amplifiers are responsive to respective ones of a pair of output signals supplied by said reference output driver circuit to the pair of reference resistors.

* * * * *